(12) United States Patent
Su et al.

(10) Patent No.: US 9,544,605 B2
(45) Date of Patent: Jan. 10, 2017

(54) NESTED ENTROPY ENCODING

(71) Applicant: DOLBY INTERNATIONAL AB, Amsterdam Zuidoost (NL)

(72) Inventors: Yeping Su, Camas, WA (US); Christopher A. Segall, Camas, WA (US)

(73) Assignee: DOLBY INTERNATIONAL AB, Amsterdam Zuidoost (NL)

( * ) Notice: Subject to any disclaimer, the term of this patent is extended or adjusted under 35 U.S.C. 154(b) by 0 days.

(21) Appl. No.: 15/189,433

(22) Filed: Jun. 22, 2016

(65) Prior Publication Data

US 2016/0309151 A1    Oct. 20, 2016

Related U.S. Application Data

(63) Continuation of application No. 14/824,305, filed on Aug. 12, 2015, now Pat. No. 9,414,092, which is a (Continued)

(51) Int. Cl.
*H04N 7/12* (2006.01)
*H04N 11/02* (2006.01)
(Continued)

(52) U.S. Cl.
CPC ........... *H04N 19/13* (2014.11); *H03M 7/4031* (2013.01); *H03M 7/42* (2013.01); *H03M 7/6076* (2013.01); *H04L 45/745* (2013.01); *H04N 19/15* (2014.11); *H04N 19/176* (2014.11); *H04N 19/46* (2014.11); *H04N 19/52* (2014.11); *H04N 19/61* (2014.11); *H04N 19/70* (2014.11); *H04N 19/91* (2014.11)

(58) Field of Classification Search
None
See application file for complete search history.

(56) References Cited

U.S. PATENT DOCUMENTS 5,469,226 A    11/1995  David et al.
7,199,735 B1 *  4/2007  Wen ................ H04N 19/91
                                              341/107

(Continued)

FOREIGN PATENT DOCUMENTS

JP    10224800    8/1998
JP    200955519   3/2009

OTHER PUBLICATIONS

Bossen et al. "Simplified motion vector coding method," Joint Collaborative Team on Video Coding (JCT-VC) of ITU-T SG16 WP3 and ISO/IEC JTC1/SC29/WG11 2nd Meeting: Geneva, CH, Jul. 21-28, 2010 (Document: JCTVC-B094), 5 pgs.

(Continued)

*Primary Examiner* — Frederick Bailey
*Assistant Examiner* — Talha M Nawaz
(74) *Attorney, Agent, or Firm* — Fish & Richardson P.C.

(57) ABSTRACT

Methods and systems for improving coding decoding efficiency of video by providing a syntax modeler, a buffer, and a decoder. The syntax modeler may associate a first sequence of symbols with syntax elements. The buffer may store tables, each represented by a symbol in the first sequence, and each used to associate a respective symbol in a second sequence of symbols with encoded data. The decoder decodes the data into a bitstream using the second sequence retrieved from a table.

3 Claims, 7 Drawing Sheets

Related U.S. Application Data continuation of application No. 12/896,795, filed on Oct. 1, 2010, now abandoned.

(51) Int. Cl.

| | | |
|---|---|---|
| H04N 11/04 | (2006.01) | |
| H04N 19/13 | (2014.01) | |
| H04N 19/91 | (2014.01) | |
| H03M 7/40 | (2006.01) | |
| H03M 7/42 | (2006.01) | |
| H03M 7/30 | (2006.01) | |
| H04N 19/52 | (2014.01) | |
| H04N 19/176 | (2014.01) | |
| H04N 19/70 | (2014.01) | |
| H04N 19/46 | (2014.01) | |
| H04N 19/61 | (2014.01) | |
| H04N 19/15 | (2014.01) | |
| H04L 12/741 | (2013.01) | |

(56) References Cited

U.S. PATENT DOCUMENTS

| | | | |
|---|---|---|---|
| 7,281,771 B1 | 10/2007 | Wen et al. | |
| 8,116,578 B2* | 2/2012 | Han | H04N 19/51 375/240.03 |
| 8,271,293 B2* | 9/2012 | You | G10L 19/008 375/240 |
| 8,290,055 B2* | 10/2012 | Ameres | H04N 7/50 375/240.16 |
| 8,675,736 B2 | 3/2014 | Huang et al. | |
| 2004/0114689 A1* | 6/2004 | Zhang | H04N 19/70 375/240.16 |
| 2004/0190615 A1* | 9/2004 | Abe | H04N 19/56 375/240.15 |
| 2004/0213468 A1* | 10/2004 | Lee | H04N 19/197 382/236 |
| 2004/0233076 A1 | 11/2004 | Zhou | |
| 2004/0263361 A1* | 12/2004 | Pearson | H04N 19/40 341/50 |
| 2005/0062885 A1 | 3/2005 | Kadono et al. | |
| 2005/0226335 A1* | 10/2005 | Lee | H04N 19/56 375/240.16 |
| 2006/0008006 A1* | 1/2006 | Cha | H04N 19/176 375/240.16 |
| 2006/0013310 A1* | 1/2006 | Lee | H04N 19/159 375/240.16 |
| 2006/0126962 A1* | 6/2006 | Sun | H04N 19/139 382/268 |
| 2006/0165301 A1* | 7/2006 | Cha | H04N 19/105 382/240 |
| 2007/0014358 A1* | 1/2007 | Tourapis | H04N 19/56 375/240.15 |
| 2007/0268964 A1* | 11/2007 | Zhao | H04N 19/56 375/240.1 |
| 2008/0043832 A1* | 2/2008 | Barkley | H04N 21/234327 375/240 |
| 2008/0043845 A1* | 2/2008 | Nakaishi | H04N 19/176 375/240.16 |
| 2008/0181308 A1* | 7/2008 | Wang | H04N 19/105 375/240.16 |
| 2009/0060036 A1 | 3/2009 | Kotaka | |
| 2009/0168878 A1* | 7/2009 | Kawashima | H04N 19/503 375/240.13 |
| 2009/0304084 A1* | 12/2009 | Hallapuro | H04N 19/52 375/240.16 |
| 2010/0027663 A1* | 2/2010 | Dai | H04N 19/159 375/240.16 |
| 2010/0232507 A1* | 9/2010 | Cho | H04N 19/597 375/240.16 |
| 2010/0290530 A1* | 11/2010 | Huang | H04N 19/139 375/240.16 |
| 2012/0082229 A1 | 4/2012 | Su et al. | |
| 2013/0027230 A1* | 1/2013 | Marpe | H03M 7/4006 341/107 |

OTHER PUBLICATIONS

Election/Restriction Requirement in U.S. Appl. No. 12/896,795, mailed Jan. 29, 2013.
Final Office Action in U.S. Appl. No. 12/896,795, mailed Apr. 30, 2013.
Final Office Action in U.S. Appl. No. 12/896,800, mailed Sep. 27, 2013.
Final Office Action issued by the United States Patent and Trademark Office for U.S. Appl. No. 12/896,795, mailed Dec. 16, 2014.
Final Office Action issued by the United States Patent and Trademark Office for U.S. Appl. No. 12/896,795, mailed Mar. 27, 2014.
Final Office Action issued in U.S. Appl. No. 12/896,800, mailed Aug. 6, 2014.
G. Laroche et al. Article a Spatio-Temporal Competing Scheme for the Rate-Distortion Optimized Selection and Coding of Motion Vectors, 14th European Signal Processing Conference (EUSIPCO 2006), Florence, Italy, Sep. 4-8, 2006, 5 pgs.
International Search Report dated Jan. 17, 2012, International Patent Application No. PCT/JP2011/073149, Sharp Kabushiki Kaisha, 10 pages.
International Search Report, dated Jan. 17, 2012, International Pal. App. No. PCT/JP2011/073153, Sharp Kabushiki Kaisha, 9 pgs.
Jung et al. "Competition-Based Scheme for Motion Vector Selection and Coding," ITU—Telecommunications Standardization Sector Study Group 16 Question 6 Video Coding Experts Group (VCEG) 29th Meeting: Klagenfurt, Austria, Jul. 17-17, 2006 (Document: VCEG-AC06), 7 pgs.
Nonfinal Office Action issued by the United States Patent and Trademark Office for U.S. Appl. No. 12/896,795, mailed Jul. 25, 2014.
Nonfinal Office Action issued in U.S. Appl. No. 12/896,795, mailed Aug. 21, 2013.
Nonfinal Office Action issued in U.S. Appl. No. 12/896,795, mailed Mar. 11, 2013.
Nonfinal Office Action issued in U.S. Appl. No. 12/896,800, mailed Apr. 29, 2013.
Nonfinal Office Action issued in U.S. Appl. No. 12/896,800, mailed Jan. 20, 2015.
Nonfinal Office Action issued in U.S. Appl. No. 12/896,800, mailed Feb. 6, 2014.
Notice of Noncompliant Amendment issued in U.S. Appl. No. 121896,795, mailed Jan. 31, 2014.
Office Action issued by the Patent Office of Japan for corresponding JP Application No. 2013-514449, mailed May 7, 2015.
Office Action issued by the United States Patent and Trademark Office for U.S. Appl. No. 12/896,795, mailed Apr. 20, 2015.
Office Action issued in Japanese Application No. 2013-514449 on Aug. 18, 2015, 13 pages (with English translation).
Office Action issued in U.S. Appl. No. 12/896,800 on Feb. 26, 2016, 7 pages.
Office Action issued in U.S. Appl. No. 14/882,586 on Mar. 23, 2016, 10 pages.
Puri et al., "Video coding using the H.264/MPEG-4 AVC compression standard," Signal Processing: Image Communication 19 (2004) pp. 793-849.
Richardson, rain E.G. H.264 and MPEG-4 Video Compression: Video Coding for next Generation Multimedia. Chichester: Wiley, 2003, pp. vii-281.
U.S. Appl. No. 12/896,795, filed Oct. 1, 2010.
U.S. Appl. No. 12/896,800, filed Oct. 1, 2010.

* cited by examiner

NESTED ENTROPY ENCODING

CROSS-REFERENCE TO RELATED APPLICATIONS

This application is a continuation of U.S. application Ser. No. 14/824,305, filed Aug. 12, 2015, which is a continuation of U.S. application Ser. No. 12/896,795, filed Oct. 1, 2010. The contents of the foregoing applications are hereby incorporated by reference in their entirety.

BACKGROUND OF THE INVENTION

Modern video transmission and display systems, and particularly those systems that present high-definition content, require significant data compression in order to produce a visually acceptable motion picture, because transmission media simply cannot transmit an uncompressed sequence of video frames at a fast enough rate to appear as continuous motion to the human eye. At the same time, and again to produce a visually-acceptable picture, the compression technique used should not unduly sacrifice image quality by discarding too much frame data.

To achieve these dual, and conflicting goals, video compression and encoding standards such as MPEG and H.264 take advantage of temporal redundancy in the sequence of video frames. In other words, in the vast majority of video sequences of interest to a person, adjacent frames typically show the same objects or features, which may move slightly from one frame to another due either to the movement of the object in the scene being shot (producing local motion in a frame), the movement of the camera shooting the scene (producing global motion), or both.

Video compression standards employ motion estimation to define regions in an image, which may correspond to objects, and associate with those regions a motion vector that describes the inter-frame movement of the content in each region so as to avoid redundant encoding and transmission of objects or patterns that appear in more than one sequential frame, despite appearing at slightly different locations in sequential frames. Motion vectors may be represented by a translational model or many other models that approximate the motion of a real video camera, such as rotation, translation, or zoom. Accordingly, motion estimation is the process of calculating and encoding motion vectors as a substitute for duplicating the encoding of similar information in sequential frames.

Though motion vectors may relate to the whole image, more often they relate to small regions if the image, such as rectangular blocks, arbitrary shapes, boundaries of objects, or even individual pixels. There are various methods for finding motion vectors. One of the popular methods is block-matching, in which the current image is subdivided into rectangular blocks of pixels, such as 4.times.4 pixels, 4.times.8 pixels, 8.times.8 pixels, 16.times.16 pixels, etc., and a motion vector (or displacement vector) is estimated for each block by searching for the closest-matching block in the reference image, within a pre-defined search region of a subsequent frame.

As implied by this discussion, the use of motion vectors improves coding efficiency for any particular block of an image by permitting a block to be encoded only in terms of a motion vector pointing to a corresponding block in another frame, and a "residual" or differential between the target and reference blocks. The goal is therefore to determine a motion vector for a block in a way that minimizes the differential that needs to be encoded. Accordingly, numerous variations of block matching exist, differing in the definition of the size and placement of blocks, the method of searching, the criterion for matching blocks in the current and reference frame, and several other aspects.

With conventional motion compensation, an encoder performs motion estimation and signals the motion vectors as part of the bitstream. The bits spent on sending motion vectors can account for a significant portion of the overall bit budget, especially for low bit rate applications. Recently, motion vector competition (MVC) techniques have been proposed to reduce the amount of motion information in the compressed bitstream. MVC improves the coding of motion vector data by differentially encoding the motion vectors themselves in terms of a motion vector predictor and a motion vector differential, where the motion vector predictor is usually selected by the encoder from a number of candidates so as to optimize rate distortion, where the candidate motion vectors consist of previously encoded motion vectors for either adjacent blocks in the same frame and/or a subset of motion vectors in a preceding frame. In other words, just as the use of a motion vector and a differential improves coding efficiency of block data by eliminating redundancies between information in sequential frames, the coding of motion vectors can exploit redundancies in situations where motion vectors between sequential frames do not change drastically, by identifying an optimal predictor, from a limited set of previously-encoded candidates, so as to minimize the bit length of the differential. The predictor set usually contains both spatial motion vector neighbors and temporally co-located motion vectors, and possibly spatiotemporal vectors.

Even using motion vector competition techniques when encoding video, however, the necessary bit rate to preserve a desired quality is often too high for the transmission medium used to transmit the video to a decoder. What is needed, therefore, is an improved encoding system for video transmission.

The foregoing and other objectives, features, and advantages of the invention will be more readily understood upon consideration of the following detailed description of the invention taken in conjunction with the accompanying drawings.

BRIEF DESCRIPTION OF THE SEVERAL DRAWINGS

FIGS. 1A and 1B generally illustrate motion vector competition.

Figure 6:
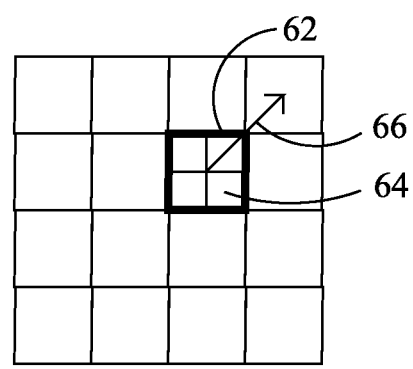

FIG. 6 generally illustrates an alternate embodiment of encoding a temporally co-located motion vector in a candidate set of motion vectors.

DETAILED DESCRIPTION OF PREFERRED EMBODIMENTS

Figure 1A:
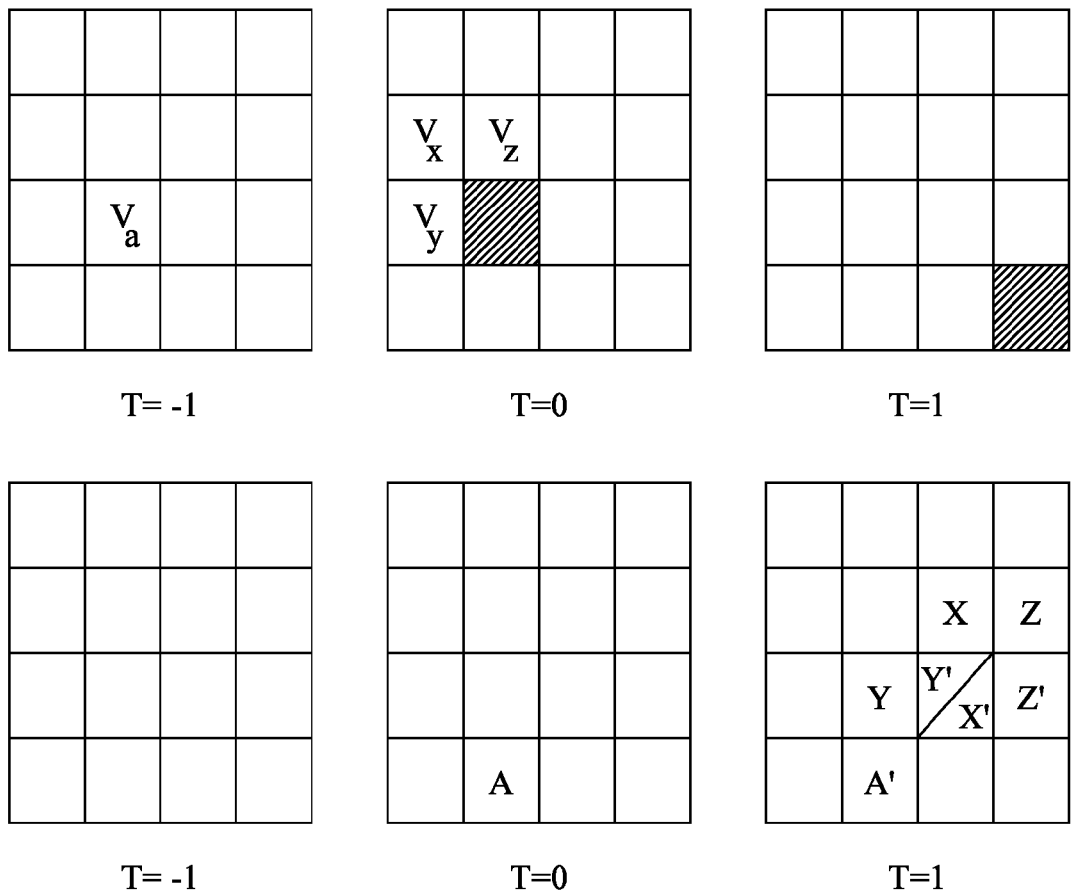
Figure 1B:
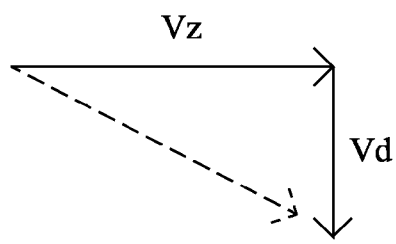

Referring to FIGS. 1A and 1B, a motion vector for a candidate block (shown in cross-hatch) in a current frame at T=0 points to the cross-hatched block in subsequent frame at t=1. This motion vector may be encoded with reference to a candidate set of motion vectors V.sub.a, V.sub.X, V.sub.y, and V. In this example, motion vector V.sub.a is a co-located motion vector in the preceding frame at t=−1 and points to block A in the current frame. Motion vectors V.sub.X, V.sub.y, and V.sub.Z are previously-encoded motion vectors in the current frame and point to blocks X, Y, and Z, respectively, in the subsequent frame at T=1. FIG. 1A also shows the blocks A', X', Y', and Z' that the respective motion vectors would point to if used when encoding the candidate block.

As can be seen in FIG. 1B, using the motion vector competition (MVC) procedure, motion vector V.sub.Z would be selected to minimize the code length of the differential V.sub.d, which in that instance, would only require a value of "1" in a single component (down) of the vector. All other differential motion vectors either would require encoding two components or would have a larger value for a single component.

It should be understood that the foregoing illustration was simplified in that different block sizes may be used, each block may represent a single pixel, and many more motion vectors could be included in the candidate set. For example, all motion vectors previously calculated in the current frame could be included in the candidate set, as well as any motion vectors calculated for preceding frames. Moreover, the candidate set may include a desired number of arbitrary motion vectors useful to capture large and sudden motions in the scene.

Figure 2:
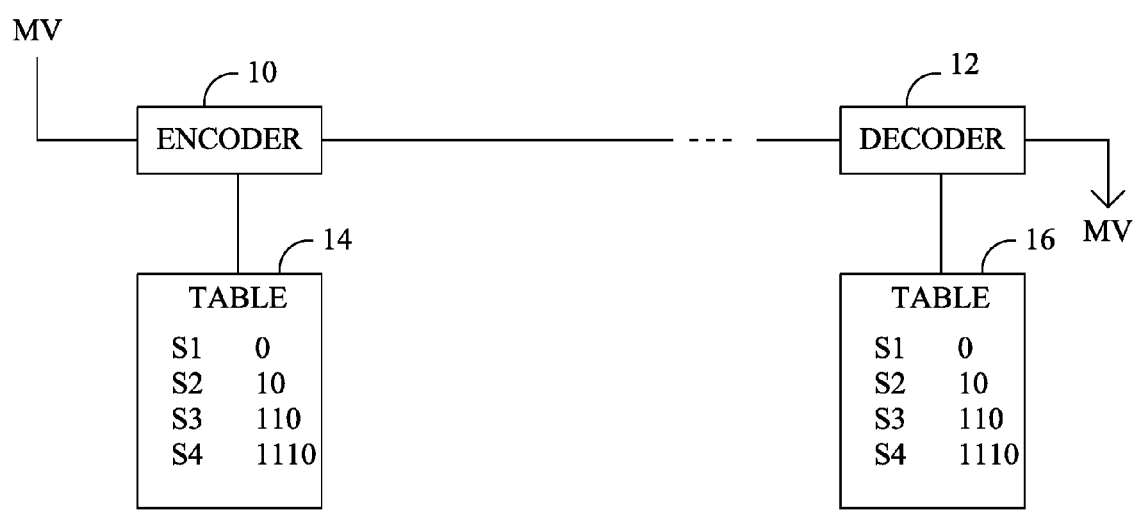
FIG. 2 shows an exemplary system for encoding and decoding motion vectors.

Referring to FIG. 2, and continuing with the preceding example, the selected motion vector Vz will need to be encoded. One straightforward approach is for an encoder 10 to assign a value to each candidate motion vector in a table 14 of symbols, which assuming a variable-length entropy encoding method such as Huffman or arithmetic encoding, might look something like:

| Motion Vector Candidate | Symbol |
|---|---|
| $V_a$ | 0 |
| $V_x$ | 10 |
| $V_y$ | 110 |
| $V_z$ | 1110 |

Note that none of the symbols are a prefix of another symbol, so that the decoder 12 can correctly parse the received bitstream by, in this example, stopping at a received zero and decode the received bitstream with reference to a corresponding table 16. Moreover, the encoder and decoder will preferably collect statistics as the bitstream is encoded and decoded and rearrange the assignments of symbols to the motion vector candidates, in the respective tables 14 and 16, so that at any given time the motion vector having the highest frequency receives the shortest symbol, etc. This process is generally referred to as entropy coding, and will usually result in significant, lossless compression of the bitstream. The encoder 10 and the decoder 12 use the same methodology to construct and update the tables 14 and 16 initialized from the beginning of the bitstream, respectively, so that for every symbol, the table 16 used to encode that symbol is identical to the table used to decode the symbol.

Even with entropy coding, the system shown in FIG. 2 can result in significant overhead when signaling which predictor is chosen from the set of candidate motion vectors. This is particularly true if the number of predictors is large. However, the more predictors used, the more efficiency is gained when encoding the differential motion vector. In order to further reduce the overhead of signaling which predictor is chosen, additional techniques may be employed.

First, the set of candidate motion vector predictors may be trimmed to eliminate duplicate vectors. For example, in FIG. 1A, the vectors V.sub.x, V.sub.y are identical, hence one of the motion vectors cam be trimmed, and as a result, the largest symbol 1110 in the table above can be eliminated. Second, knowing the size of the trimmed motion predictor set means that the last bit of the last symbol in the trimmed set can be omitted, e.g. in the previous example where one of V.sub.X, V.sub.y was trimmed, leaving 110 as the last symbol, this symbol may simply be encoded as 11 give that this bit sequence distinguishes over all the previous symbols in the table, and the decoder knows from the size of the trimmed set that there are no further symbols.

These two additional techniques may significantly reduce the overhead of signaling the selected motion vector predictor. However, the consequence of these techniques is that the entropy decoding of the motion vector predictor will depend on the motion predictor set. That is, a bitstream cannot be correctly parsed before the complete set of motion predictors are available and correctly constructed. Such a constraint has severe impact on the decoder's error resilience, resulting in two types of disadvantages. First is temporal dependency; if a picture is corrupted or lost, decoding of subsequent pictures could fail in the parsing stage. Second is spatial dependency; if certain area of a picture is corrupted, decoding of subsequent areas in the same picture could fail in the parsing stage.

This may be a significant disadvantage. If motion vector data from either a prior frame or a current frame is lost, but needed to reconstruct the full candidate set of motion vectors, then the decoder will be unable to even parse the bitstream until an independently-coded frame is reached. This is a more severe consequence than the mere inability to decode correctly parsed data due to the loss of information used to code motion vectors, differential motion vectors, and residuals, because in this latter circumstance any parsed data, subsequently received in the bitstream and that does not rely on the missing data, can be decoded. Once the decoder cannot parse the bitstream, however, it has no way of decoding any subsequent symbols.

Though counterintuitive, the tradeoff between error resilience and overhead reduction is not intractable. The present inventors further realized that, just as coding efficiency gains are realized by signaling a selected one from a candidate set of motion vectors, coding efficiency gains could theoretically be achieved by signaling a selected one of a group of ordered candidate sets. This gain in coding efficiency could work, not only in tandem with techniques such as motion vector trimming and using truncated unary codes, but actually as a substitute for those techniques, i.e. preserving spatial and temporal independence when parsing the bitstream by not trimming duplicate candidate motion vectors and not truncating the highest-bit-length symbol.

Figure 3:
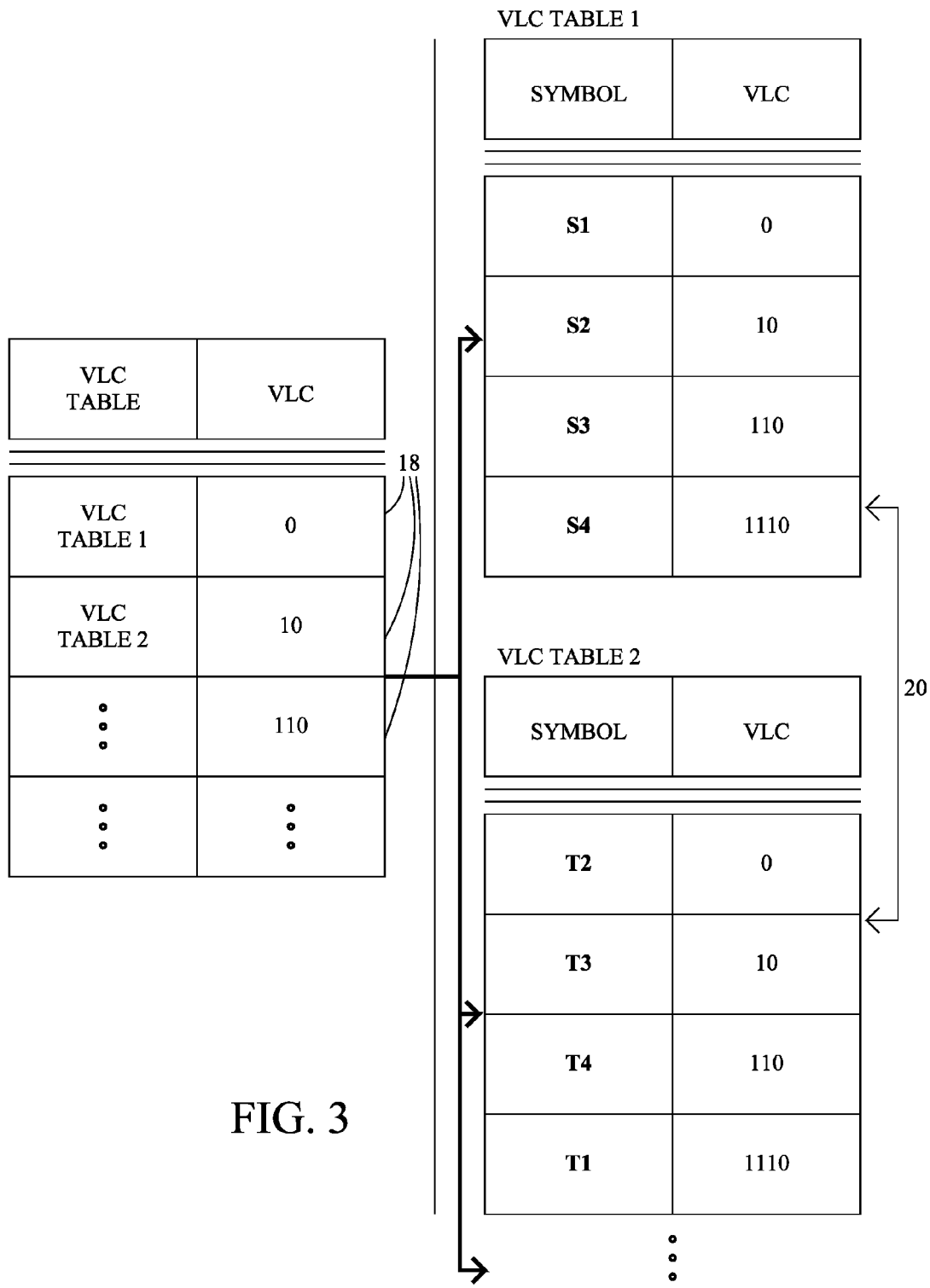
FIG. 3 shows a nested entropy encoding structure.

Specifically, referring to FIG. 3, an encoder or a decoder may utilize a nested entropy encoding structure where one of a plurality of coded symbols 18 is assigned to each of a plurality of entropy-coded candidate set of motion vectors, shown as separate VLC tables 20. It should be understood that any particular one of the VLC tables 20 may include a motion vector set that differs from that another VLC table 20, meaning that a particular motion vector that appears in one VLC table 20 does not need to appear in all VLC tables 20. The encoder may signal one of the symbols 18 that corresponds to that one of the VLC tables 20 (candidate sets) for which the signaled motion vector has the highest frequency and therefore the smallest code length. Coded symbols 18 identifying a respective candidate set can themselves be entropy-coded, if desired, or may alternatively be encoded with a fixed length code, or any other appropriate coding technique.

Implicit in the foregoing discussion is the assumption that there is some non-random distribution among the plurality of all possible candidate sets of motion vectors. If, for example, the respective individual candidate sets simply comprise all permutations of the symbols included in each, randomly distributed with respect to each other, there would be no reason to expect a net gain in coding efficiency because the number of candidate sets of motion vectors, needed to guarantee that a sufficient number of candidate motion vectors appear in a candidate set high enough in the table to benefit from a reduced code length, would be too large. Essentially, what efficiency gained in coding the selected one of the candidate motion vector is lost in the overhead of coding the symbol associated with the particular candidate set. This makes sense; just as the entropy coding of motion vectors works due to the predictable spatial and temporal relationship between the motion vectors, making some candidate motion vectors more likely than others, the disclosed nested entropy encoding structure would be expected to further compress the bitstream only if some of the possible permutations of symbols in the candidate set are more likely than others, such that the higher-code-length candidate sets are not used as often as the lower-code-length candidate sets.

Figure 4:
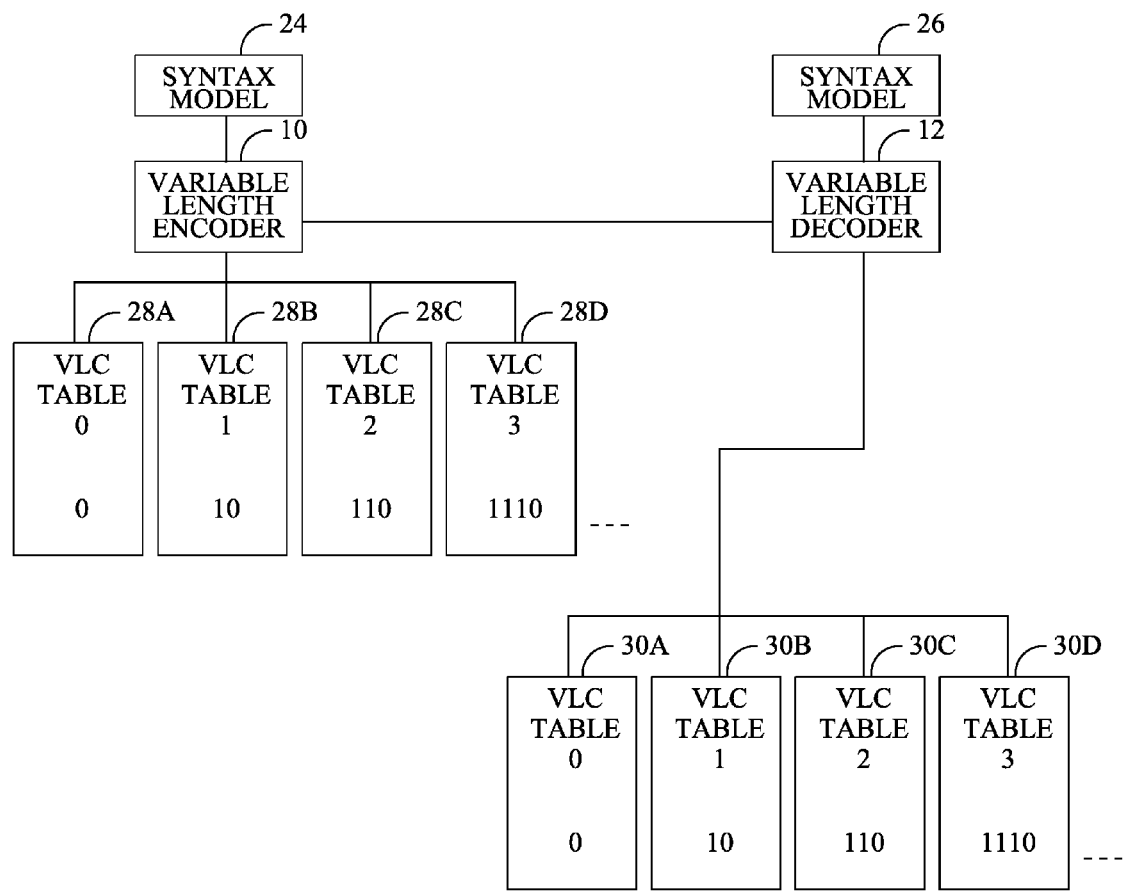
FIG. 4 shows a system using the nested entropy encoding structure depicted in FIG. 3.

Upon investigation, the present inventors discovered that, not only does the disclosed nested entropy encoding structure in fact improve coding efficiency, but the syntax elements of neighboring pixels or blocks of pixels are correlated with the probabilities of the ordering of candidate motion vectors in a set. Referring to FIG. 4, for example, an encoder 10 may have access to syntax symbols from a syntax model 24 that defines a set of syntax elements in the encoded data to be used to differentiate multiple VLC tables of candidate sets of motion vectors, and therefore also defines a set of syntax elements used by the encoder and decoder to determine the VLC table with which to encode the selected ones of the candidate motion vectors with code symbols. These syntax elements could for example, relate to selected candidate motion vectors in spatially or temporally neighboring blocks of pixels, relate to combinations of such selected candidate motion vectors, or alternatively relate to any factor determined to have a relationship to the probability distribution of selected motion vectors in a candidate set. In one embodiment, an encoder 10 (and hence a decoder 12) will include a learning agent that tries different combinations of syntax elements so as to intelligently maximize coding efficiency. Stated differently, the encoder 10 intelligently optimizes coding efficiency by iteratively choosing different combinations of available said syntax elements, measuring a change in coding efficiency following each chosen combination, and responding accordingly by replacing one or more syntax elements in the combination.

With the syntax symbol from the syntax model 24, the encoder 10 may then use an applicable motion vector symbol for the selected motion vector for the current block from a VLC table 28a, 28b, 28c, 28d, etc, and encode the motion vector symbol in a bitstream to the decoder 12. The encoder 10 also updates the order of the motion vector symbols in the VLC table used based on the selected symbol. In one embodiment, any change in the frequency distribution of symbols in a table results in the symbols being reordered. In an alternate embodiment, the encoder 10 (and the decoder 12) keeps track of the most frequently-occurring symbol in the un-reordered set and ensures that that symbol is at the top of the table, i.e. that it has the smallest code length. Note that, in this example, because the syntax symbol is determined solely by the syntax of previously-encoded data, the encoder need not encode the syntax symbol along with the motion vector symbol, so long as the decoder 12 uses the same syntax model to determine the particular VLC table 30a, 30b, 30c, and 30d, from which to extract the received motion vector symbol. In other words, when the encoder 10 uses the syntax of the previously-encoded data to differentiate the VLC tables, updating the order of symbols in those tables in the process, a very high degree of coding efficiency can be achieved.

When the decoder 12 receives a coded bitstream from the encoder 10, the decoder parses the bitstream to determine the relevant VLC table for a received symbol, using a syntax model 26 if available, to decode the received symbols to identify the selected motion vector from the candidate set. The decoder also updates the respective VLC tables in the same manner as does the encoder 10.

The motion vector predictor set may contain candidate motion vectors spatially predictive of a selected motion vector (i.e. candidates in the same frame as the current block), candidate motion vectors temporally predictive of a selected motion vector (i.e. candidates at the co-located block in the frame preceding the current block), and candidate motion vectors spatiotemporally predictive of a selected motion vector (i.e. candidates in the frame preceding the current block spatially offset from the co-located block). As noted previously, the disclosed nested entropy encoding structure permits a decoder to parse a bitstream without trimming candidate motion vectors or truncating code symbols, thereby preserving spatial and temporal independence in the parsing process, and preserving error resilience while at the same time achieving significant coding efficiencies. Alternatively, the nested entropy encoding structure can be used in tandem with the techniques of trimming candidate motion vectors or truncating code symbols, while at least partially preserving error resilience.

Figure 5A:
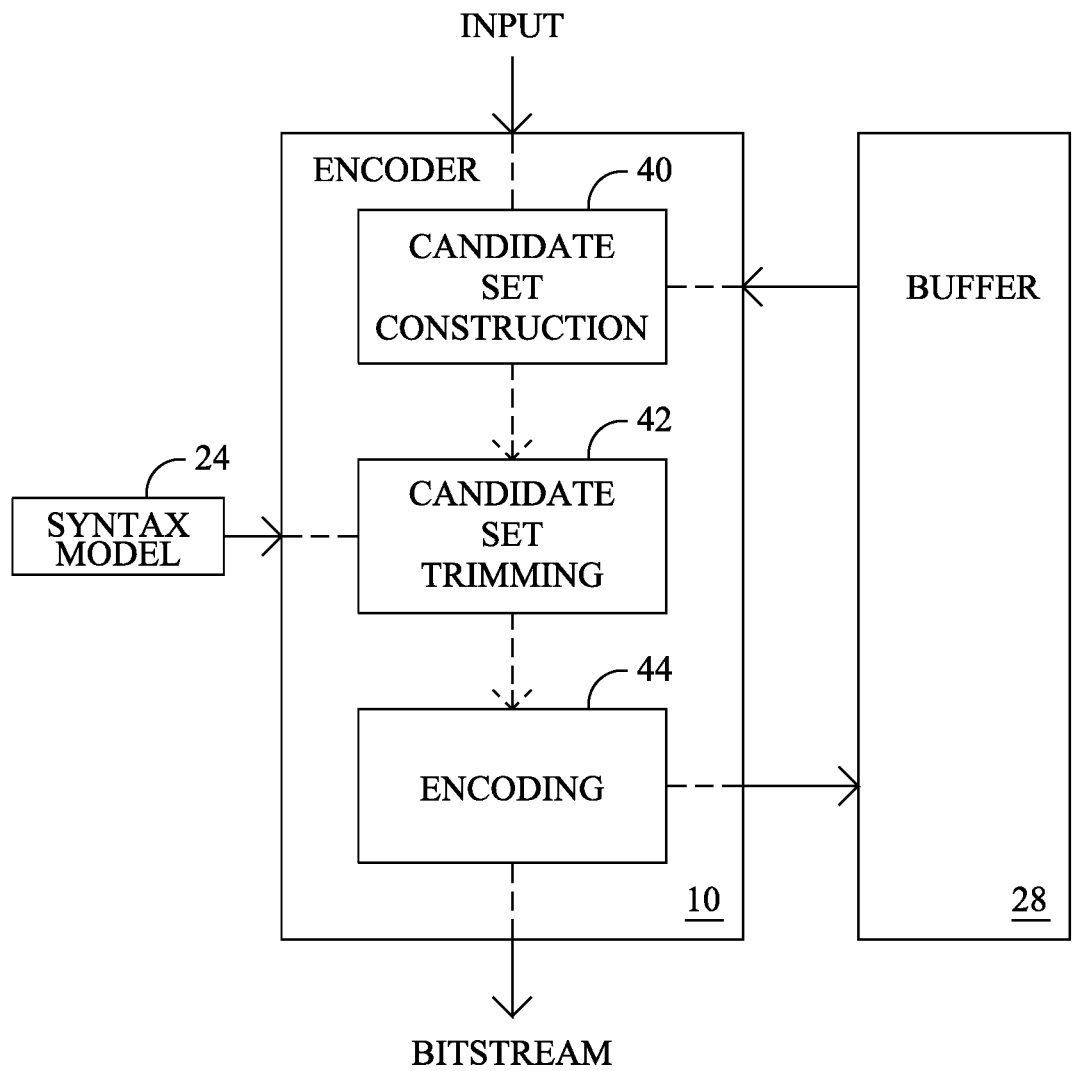
FIG. 5A shows an exemplary encoder capable of trimming a candidate set of motion vectors.

For example, referring to FIG. 5A, an encoder 10 may include a candidate motion vector set construction module 40 that retrieves from one or more buffers 28 the full set of candidate motion vectors applicable to a current block being encoded. A candidate motion vector set trimming module 42 then selectively trims the set of candidate motion vectors according to predefined rules, by applying a syntax model 24 to the set of candidate motion vectors, prior to encoding a selected motion vector with an encoding module 44, which in turn selects a symbol based on the trimmed set of candidates. One potential predefined rule, for example, may prevent the candidate motion vector set module 42 from trimming motion vector predictors derived from previously reconstructed/transmitted frames. In other words, in the case that two motion vector predictors have the same value but one motion vector predictor corresponds to data in a current frame and a second motion vector predictor corresponds to data in a second frame, the two motion vector predictors are both included in the trimmed set. This preserves temporal independence.

As another example, a predefined rule may prevent the candidate motion vector set trimming module 42 from trimming motion vector predictors derived from regions that are located in different slices, so as to preserve spatial independence. As an additional embodiment, a predefined rule may prevent the candidate motion vector set trimming module 42 from trimming motion vector predictors derived from regions that are located in different entropy slices, where an entropy slice is a unit of the bit-stream that may be parsed without reference to other data in the current frame.

Figure 5B:
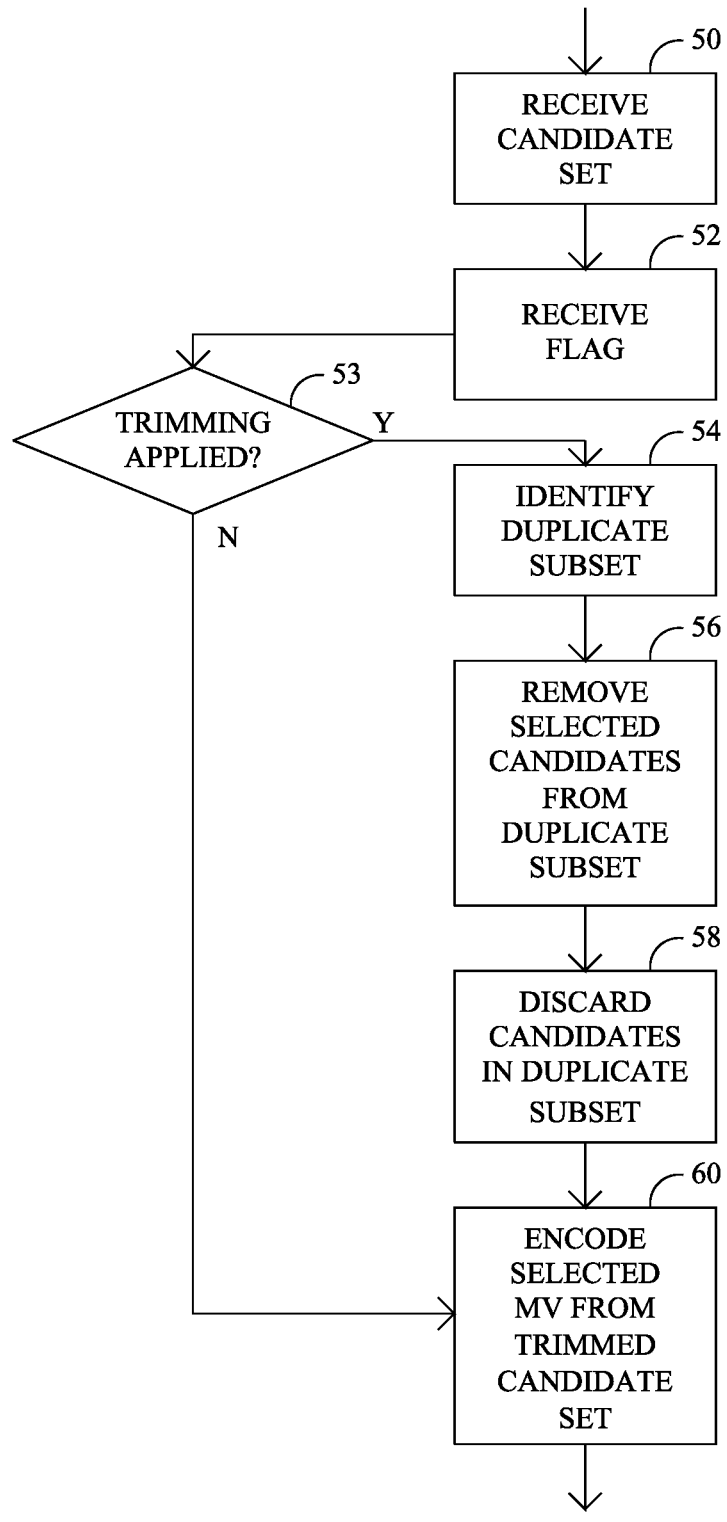
FIG. 5B shows an exemplary method of trimming a candidate set of motion vectors used by the encoder of FIG. 5.

These two rules are stated for purposes of illustration only, as additional rules may be created as desired. FIG. 5B, for example, shows a generalized technique for applying any one of a wide variety of trimming rule sets that are signaled using a novel flag. At step 50, an encoder 10 receives a candidate set of motion vector predictors from a buffer 28, for example. At step 52 a flag is signaled by the encoder (or received by the decoder) that is used at decision step 53 to indicate whether trimming is applied, and optionally a trimming rule set as well that may be used to define which vectors will be trimmed. If the flag indicates that no trimming is to occur, the technique proceeds to step 60 and encodes the selected motion vector using the full set of candidate motion vectors. If, however, the flag indicates that, under a given rule set, trimming is to occur, then the subset of duplicate motion vectors is identified in step 54. Thus, the subset of duplicate motion vectors can be considered in one embodiment as a maximized collection of motion vectors for which each member of the subset has an identical motion vector not included in the subset. In other words, the subset may be seen as one that excludes from the subset any motion vector in the full set of candidates that has no duplicate an also excludes from the subset exactly one motion vector in a collection of identical duplicates.

At step 56, according to predefined rules of the rule set, selected candidate motion vectors may be selectively removed from the subset of duplicates. It is this step that enables spatial and/or temporal independence to be preserved. Optionally, candidate motion vectors can also be added to the subset of duplicate motion vectors, for reasons explained in more detail below. Stated on a conceptual level, the purpose of steps 54 and 56 is simply to apply a rule set to identify those motion vectors that will be trimmed from the full candidate set. Once this subset has been identified, the candidate motion vectors in this subset is trimmed at step 58 and the encoder then encodes the selected motion vector, from those remaining, based on the size of the trimmed set at step 60.

To illustrate the functionality of the generalized technique shown in FIG. 5A, consider the example of a temporal_mvp_flag_used by the encoder to signal into the bitstream a true/false condition of whether the selected motion vector, from the candidate set, is a temporally-located motion vector. Also, initially assume that the applicable rule set for this flag is intended to preserve temporal independence. If the temporal_mvp_flag_indicates that a temporal predictor is selected by the encoder, the temporal predictor subset in the candidate set will not be trimmed, because to do so would create temporal dependency. However, the spatial predictor subset of the candidate set can be trimmed because the decoder 12 has foreknowledge of the size of the temporal predictor subset.

If, on the other hand, the temporal_mvp_flag_signals that a temporal predictor is not selected by the encoder, the candidate set can not only be trimmed of duplicates, but in some embodiments can also be trimmed of temporal predictors, resulting in a drastically diminished candidate set that needs to be encoded. It should also be recognized that, if an applicable rule set permits both temporal and spatial dependencies, the a temporal_mvp_flag_can be used, regardless of its value, to trim duplicates of the temporal or spatial subset signaled by the flag and to trim the entire subset not signaled by the flag.

As it happens, the inventors have determined that there is a reasonable correlation between the value of the disclosed temporal_mvp_flag_and the value of a constrained_intra_pred_flag, associated with a frame, and often used in an encoded video bit stream. Specifically, the inventors have determined that there is a strong correlation between these two flags when the value of the constrained_intra_pred_flag is 1, and a substantially less strong correlation when the value of the constrained_intra_pred_flag is 0. Accordingly, to save overhead in signaling a selected motion vector, the encoder may optionally be configured to not encode the disclosed temporal_mvp_flag_when the constrained_intra_pred_flag is set to 1 for the frame of a current pixel, such that the decoder will simply insert or assume an equal value for the temporal_mvp_flag_in that instance, and to otherwise encode the temporal_mvp_flag. Alternatively, the disclosed temporal_mvp_flag_may simply be assigned a value equal to the constrained_intra_pred_flag, but preferably in this latter circumstance the value of a 0 should be associated in the defined rule set as causing the result of simply trimming duplicate vectors in the candidate set.

The disclosed nested entropy encoding structure can be additionally applied to this temporal_mvp_flag_syntax. In one embodiment, top and left neighboring flags are used to determine the predictor set template used in the entropy coding of temporal_mvp_flag. This may be beneficial if, as is the usual case, the encoder and decoder exclusively assigns entropy symbols to coded values, and also where the temporal_mvp_flag_may take on many values. In another embodiment, the predictor set template for the coding of the selected motion vector for the candidate set is made depending on the temporal_mvp_flag_of the current block.

Also, another embodiment of the invention signals if the motion vector predictor is equal to motion vectors derived from the current frame or motion vectors derived from a previously reconstructed/transmitted frame, as was previously described with respect to the temporal_mvp_flag. In this particular embodiment, however, the flag is sent indexed by the number of unique motion vector predictors derived from the current frame. For example, a predictor set template in this embodiment could distinguish all possible combinations of a first code value that reflects the combination of flags in the two blocks to the left and above the current block, e.g. 00, 01, 10, 11 (entropy coded as 0, 10, 110, and 1110) as indexed by a second code value reflective of the number of unique motion vectors in the candidate set. Alternatively, a context template in this embodiment could identify all possible combinations of a first code value that reflects whether the flags in the two blocks to the left and above the current block are identical or not, e.g. 00 and 11 entropy coded as 0 and 01 and 10 entropy coded as 10, for example, and a second code value reflective of the number of unique motion vectors in the candidate set.

An encoding scheme may include a candidate set of motion vectors that includes a large number of temporally co-located motion vectors from each of a plurality of frames, such as the one illustrated in FIG. 6. This means that, to encode the blocks 64 of a current frame, the encoder may have to access one or more buffers that contains a history of all the selected motion vectors in each of the prior frames from which a candidate motion vector is extracted. This can require an extensive amount of memory. As an alternative, the smallest-sized block of pixels used in the encoding scheme, e.g. a 2.times.2 block, may be grouped in larger blocks 62, where the motion vectors stored in the buffer, and later used as co-located motion vectors when encoding subsequent blocks, may instead be the average motion vector 66 of all the selected vectors in the respective group. This trades memory requirements for coding efficiency, as the averaging procedure tends to produce a larger differential to be encoded whenever the co-located motion vector is selected. Having said that, the reduction in coding efficiency is not all that great given that the averaged co-located vector will only be chosen if it is more efficient to use that vector than any of the alternatives in the candidate set. In addition to using an average of adjacent blocks, a vector median operation or a component-wise medial operation may be used, as can any other standard operation such as maximum, minimum, or a combination of maximum and minimum operations, commonly called a dilate, erode, open, or close operation.

In some embodiments, the operation used to group smaller-sized blocks of pixels into larger blocks may be signaled in a bit-stream from an encoder to a decoder. For example, the operation may be signaled in a sequence parameter set, or alternatively, the operation may be signaled in the picture parameter set, slice header, or for any defined group of pixels. Furthermore, the operation can be determined from a level or profile identifier that is signaled in the bit-stream.

In some embodiments, the number of smallest sized blocks that are grouped to larger blocks may be signaled in a bit-stream from an encoder to a decoder. For example, said number may signaled in the sequence parameter set, or alternatively the number may be signaled in the picture parameter set, slice header, or for any defined group of pixels. The number may be determined from a level or profile identifier that is signaled in the bit-stream. In some embodiments, the number may be expressed as a number of rows of smallest-sized blocks and a number of column of smallest-sized blocks.

It should be understood that the preceding embodiments of an encoder and/or a decoder may be used in any one of a number of hardware, firmware, or software implementations. For example, an encoder may be used in a set-top recorder, a server, desktop computer, etc., while a decoder may be implemented in a display device, a set-top cable box, a set-top recorder, a server, desktop computer, etc. These examples are illustrative and not limiting. If implemented in firmware and/or software, the various components of the disclosed encoder and decoder may access any available processing device and storage to perform the described techniques.

The terms and expressions that have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An apparatus comprising:
   a non-transitory computer-readable medium storing encoded image data, the encoded image data comprising:
   a first block adjacent to a current block in a picture;
   a second block adjacent to the current block in the picture; and
   a flag indicating whether a temporally-located motion vector can be used as a motion vector predictor,
   wherein when a motion vector of the first block is not equal to a motion vector of the second block, a motion vector predictor candidate set for the current block includes the motion vector of the first block and the motion vector of the second block, and
   when the motion vector of the first block is equal to the motion vector of the second block and the flag indicates that a temporally-located motion vector can be used as a motion vector predictor, the motion vector predictor candidate set for the current block includes the motion vector of the first block and the temporally-located motion vector,
   wherein a motion vector from the motion vector predictor candidate set is to be the motion vector predictor of the current block; and
   a processing unit for signaling a bitstream including the encoded image data to a decoder.

2. A method for encoding a motion vector predictor of a current block in a picture of a sequence of pictures, the method comprising:
   identifying a first adjacent block that is adjacent to the current block in the picture;
   identifying a second adjacent block that is adjacent to the current block in the picture;
   when a motion vector of the first adjacent block is not equal to a motion vector of the second adjacent block, generating a motion vector predictor candidate set comprising the motion vectors of both the first and the second adjacent blocks;
   when the motion vector of the first adjacent block is equal to the motion vector of the second adjacent block, generating a motion vector predictor candidate set comprising only the motion vector of the first adjacent block or the motion vector of the second adjacent block;
   generating a flag indicating whether a temporally-located motion vector can be used as a motion vector predictor;
   when the flag indicates that a temporally-located motion vector can be used as a motion vector predictor, including a motion vector of a block in another picture in the motion vector predictor candidate set;
   when the flag indicates that a temporally-located motion vector cannot be used as a motion vector predictor, excluding the motion vector of the block in another picture from the motion vector predictor candidate set; and
   selecting a motion vector from the motion vector predictor candidate set as the motion vector predictor of the current block.

3. A method for decoding a motion vector predictor of a current block in a picture of a sequence of pictures, the method comprising:
   identifying a first adjacent block which is adjacent to and left of the current block in the picture;
   identifying a second adjacent block which is adjacent to and above the current block in the picture;
   when a motion vector of the first adjacent block is not equal to a motion vector of the second adjacent block, generating a motion vector predictor candidate set comprising the motion vectors of both the first and the second adjacent blocks;
   when the motion vector of the first adjacent block is equal to the motion vector of the second adjacent block, generating a motion vector predictor candidate set comprising only the motion vector of the first adjacent block;
   receiving a flag from a bitstream indicating whether a temporally-located motion vector can be used as a motion vector predictor;

when the flag indicates that a temporally-located motion vector can be used as a motion vector predictor, including a motion vector of a block in another picture in the motion vector predictor candidate set;

when the flag indicates that a temporally-located motion vector cannot be used as a motion vector predictor, excluding the motion vector of the block in another picture from the motion vector predictor candidate set; and selecting a motion vector from the motion vector predictor candidate set as the motion vector predictor of the current block.

* * * * *